United States Patent [19]

Massey

[11] 4,450,532

[45] May 22, 1984

[54] VOLTAGE TO FREQUENCY CONVERTER

[75] Inventor: William A. Massey, Mt. Holly, N.J.

[73] Assignee: General Electric Company, King of Prussia, Pa.

[21] Appl. No.: 369,441

[22] Filed: Apr. 19, 1982

[51] Int. Cl.³ ............................................. H03L 7/00
[52] U.S. Cl. .................................... 364/703; 328/144
[58] Field of Search ............... 340/347 AD; 328/144, 328/151; 377/114

[56] References Cited

U.S. PATENT DOCUMENTS

| | | | |
|---|---|---|---|
| 3,636,336 | 1/1972 | Everett | 364/701 X |
| 3,662,163 | 5/1972 | Miller et al. | 364/701 X |
| 3,895,377 | 7/1975 | Schwalenstocker | 364/510 X |
| 4,086,884 | 5/1978 | Moon et al. | 364/442 X |
| 4,303,985 | 12/1981 | Schaffer | 364/701 |

OTHER PUBLICATIONS

Burr-Brown Research Corporation of Tuscon Arizona Specification Sheets 5-186 to 5-191, Printed in USA Jul., 1978.

*Primary Examiner*—Gareth D. Shaw
*Assistant Examiner*—Tim A. Wiens
*Attorney, Agent, or Firm*—John P. McMahon; William Freedman

[57] ABSTRACT

Circuit arrangements are disclosed for receiving an applied analog type voltage signal, and in response to the applied signal generating an output pulse string whose frequency characteristic is proportional to the square of the applied signal. In one embodiment a circuit means for creating a jittering effect is provided so as to smear or smooth abrupt discontinuities in the output pulse string. The smearing of the output pulse string improves the accuracy of its frequency characteristic.

5 Claims, 7 Drawing Figures

VOLTAGE TO FREQUENCY CONVERTER

BACKGROUND OF THE INVENTION

This invention relates to a voltage to frequency converter which generates an output pulse string whose output frequency is proportional to the square of an applied voltage signal.

Voltage to frequency converters are well known. One such voltage to frequency converter is described in U.S. Pat. No. 4,303,985 entitled "Analog Voltage to Pulse Rate or Analog to Frequency Converter", M. A. Schaffer issued Dec. 1, 1981. U.S. Pat. No. 4,303,985 describes a circuit arrangement for a voltage to frequency converter having a source of precision voltage which is utilized for the development of the analog-to-frequency conversion. The voltage to frequency converter of U.S. Pat. No. 4,303,985 develops a digital pulse train output signal whose pulse rate is proportional to the amplitude of the input voltage.

Another voltage to frequency converter is described in the specification sheets 5-186 to 5-191, printed in U.S.A. July, 1978 of Burr-Brown Research Corporation of Tuscon, Ariz. for their VFC32 device. The VFC32 device of Burr-Brown develops a digital pulse train output signal in a manner similar to the circuit of U.S. Pat. No. 4,303,985 and whose repetition rate is proportional to the amplitude of an analog input voltage.

In certain types of applications it may be desired for a voltage to frequency converter to develop a digital pulse train output signal whose rate is not restricted to being proportional to the amplitude of the applied analog input voltage. For example, a voltage to frequency converter may be desired to perform an arithmetic operation for squaring an input function in its development of the output pulse train. The squaring function may be desired for certain types of computations requiring numerical analysis. These computations may be related to a typical function such as the square of an analog-type-unwanted current ($I^2$) flowing within a transmission line so as to determine a power loss quantity such as $I^2R$ for monitoring purposes such as instrumentation. It is desired that this typical instrumented quantity ($I^2R$) be accurately developed by the voltage to frequency converter. The accurate development of this squared type function is somewhat hindered in that for relatively low values of monitored current of a transmission line, abrupt changes may cause the frequency converter to generate an abrupt change in its developed output signal which, in turn, may affect or degrade the accuracy of the voltage to frequency converter.

Accordingly, an object of the present invention is to provide a voltage to frequency converter having an accurate output frequency signal proportional to the square of the applied analog-type signal.

Still further, it is an object of the present invention to provide means for smoothing abrupt jumps in the voltage to frequency converter output signal which otherwise occur at low input signals for small percentage changes in the signal applied to the voltage-to-frequency converter.

SUMMARY OF THE INVENTION

This invention is directed to a circuit arrangement comprising a voltage to frequency converter.

The circuit arrangement receives an applied, analog type electrical signal $V_0$ and generates a pulse train output signal whose average frequency $F_3$ is proportional to the square of the applied analog type electrical $V_0$ signal. The circuit arrangement comprises:

(a) analog to frequency converter means for converting the applied analog signal $V_0$ to a first digital output signal comprising a string of pulses of a frequency $F_1 = K_1 V_0$, where $K_1$ is a predetermined analog to frequency conversion constant;

(b) means for dividing the first output signal by a predetermined divisor D so as to develop a second output signal comprising a string of pulses whose frequency is $F_2 = F_1/D$. The frequency $F_2$ is relatively lower than the frequency $F_1$;

(c) means responsive to the second output signal for generating a third output signal having a pulse rate whose frequency is equal to said frequency characteristic $F_2$ of the second output signal and a pulse width of a predetermined duration W which is less than the period of frequency $F_2$;

(d) means receiving said first and third output signals and responsive to coincidence between said first and third output signals for developing a pulse in response to each such coincidence, thereby generating a train of pulses whose average frequency $F_3$ equals (W $K_1^2 V_0^2)/D$, thus rendering $F_3$ proportional to $V_0^2$.

The features of the invention believed to be novel are set forth with particularity in the appended claims. The invention, itself, however, both as to its organization and operation, together with further objects and advantages thereof, may best be understood by reference to the following description taken in conjunction with the accompanying drawings.

DETAILED DESCRIPTION OF THE PREFERRED EMBODIMENT

Figure 1:
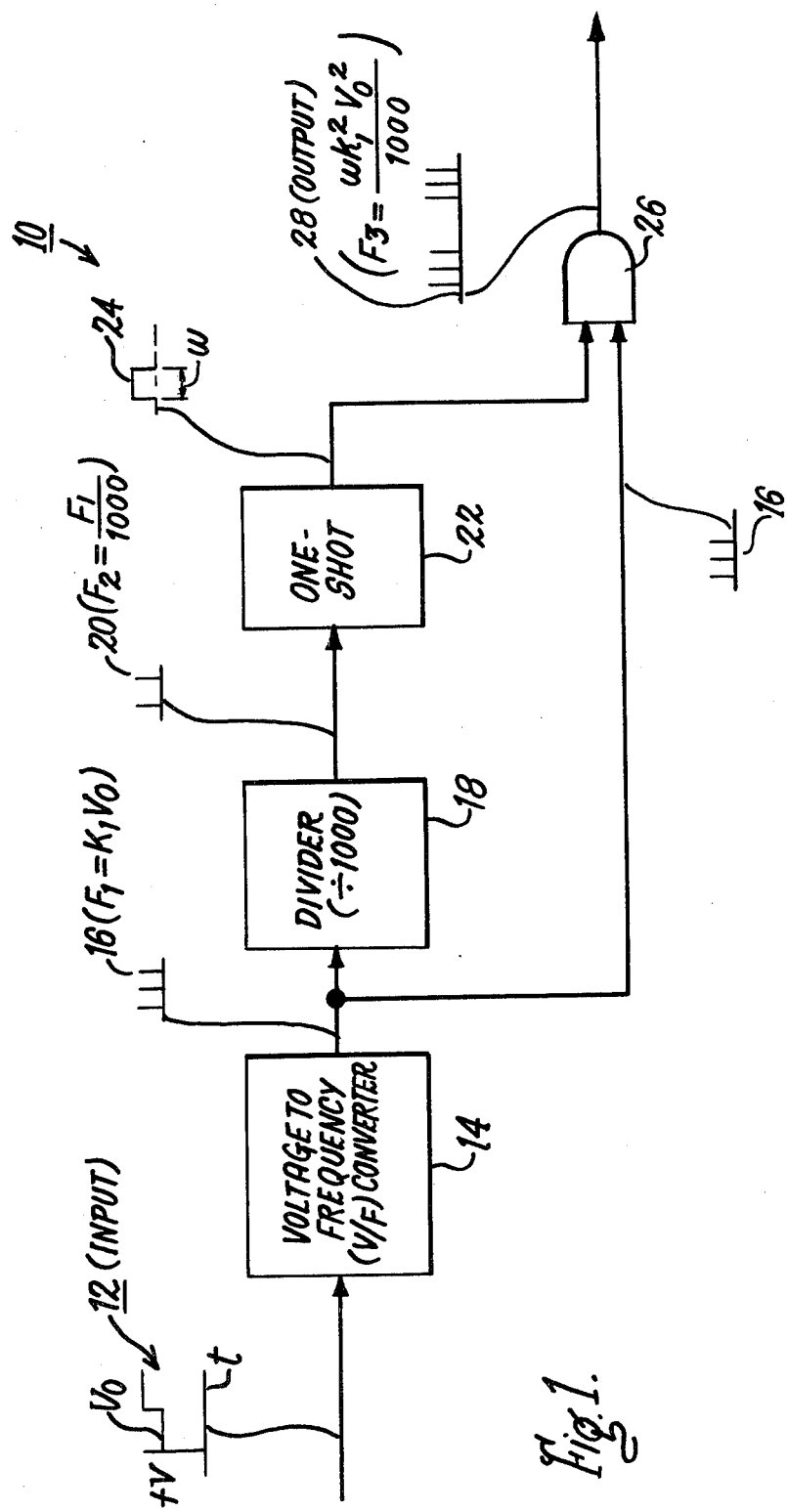
FIG. 1 shows a circuit arrangement 10 in accordance with one embodiment of the present invention.

The Circuit of FIG. 1

FIG. 1 shows a circuit arrangement 10 in accordance with one embodiment of the present invention. FIG. 1 shows a plurality of elements whose reference number, circuit function, and typical type from a typical supplier are given in Table 1.

TABLE 1

| Element | Circuit Function | Typical Type from a Supplier |
| --- | --- | --- |
| 14 | Voltage to Frequency (V/F) Converter | AD537 of Analog Devices Corp. |
| 18 | Divider (÷1000) | MC14162 of Motorola |
| 22 | One-Shot Device | MC14538 of Motorola |
| 26 | AND circuit | MC14081B of Motorola |

The circuit arrangement 10 of FIG. 1 has applied to its input an analog electrical signal ($V_0$) 12 and generates an output signal 28. Output signal 28 comprises a string of pulses whose frequency $F_3$ is proportional to the square of the applied $V_0$ signal 12.

The applied $V_0$ signal 12 is shown in FIG. 1 as being an analog-type signal $V_0$ having a Y coordinate of +V (positive voltage) and an X coordinate of t (time). The $V_0$ signal is shown as a step-like waveshape. The signal $V_0$ 12 is applied to the voltage to Frequency (V/F) Converter 14.

The Voltage to Frequency Converter 14 operates in a well-known manner, similar to description given in the "Background", so as to convert the analog signal ($V_0$) 12 to a plurality of digital pulses shown in FIG. 1 as a signal 16.

The $V_0$ signal 12 applied to the Voltage to Frequency Converter 14 may be of a positive D.C. voltage (V) having a level in the range of 0 to 10 volts and which is developed by an external source. One such external source may be a cascaded negative sequence network and rectifier both used in the art of protective relaying for developing an output signal such as signal 12. In one use of the present invention, the output signal developed by the negative sequence network and rectifier may be a quantity representative of an unwanted current flow (I) related to a power generator. Correspondingly, the circuit arrangement 10 develops a digital output signal representative of the square of the unwanted current $I^2$. The output signal 28 may be applied to an external utilization device having means, such as a counter, to perform an integration operation of the $I^2$ quantity over a period of time. The external device may also utilize a scaling function representative of a known quantity such as a resistance quantity R of the power generator. The external device may thus derive a function representative of $I^2R$ which is indicative of the $I^2R$ losses or heating manifested by the power generator.

The Voltage to Frequency (V/F) converter 14 of FIG. 1 provides the means for converting or changing the applied ($V_0$) signal 12 to a first output signal 16 comprised of a string of pulses having a frequency $F_1 = K_1 V_0$.

The Divider (÷1000) 18 provides the means for dividing the first output signal 16 by a predetermined divider (D) so as to develop a second output signal 20 comprised of a string of pulses having a frequency characteristic $F_2 = F_1/D$. As will be described, the frequency of signal 16 is divided by Divider 18 so as to develop the second output signal 20 having a frequency $F_2$ which is relatively lower than the frequency $F_1$ of signal 16. As will be further discussed hereinafter, a predetermined divisor (D) other than 1000 may be used.

The second output signal 20 is routed to the One-Shot 22 which provides means responsive to the second output signal 20 for generating a third output signal 24 having a pulse width W of a predetermined duration which is greater than the pulse width of signal 20, but less than the period of signal 20. The One-Shot 22 acts so as to develop a commonly termed gate or window type signal. The predetermined duration W of output signal 24 is a selectable value dependent on the circuit parameters of One-Shot 22. The predetermined duration W of signal 24 may have a typical value of 0.01 seconds. The third output signal 24 is routed to a first input of AND circuit 26.

The AND circuit 26 has applied to its second input the first signal 16 developed by the Voltage to Frequency (V/F) converter 14. The AND circuit combines its applied signals into a composite type output signal 28 having an average frequency $F_3$ of the desired type to be described. The AND circuit 26 provides means responsive to the coincidence between the first signal 16 having a frequency of $F_1 = K_1 V_0$ and third output signal 24 having an "ON" time of $F_2 W$ so as to generate the output signal 28 comprised of a pulse train whose average frequency $F_3$ may be expressed as:

$$F_3 = F_2 W \cdot F_1 \tag{1}$$

where W is the pulse width of signal 24.

The average frequency $F_3$ of relationship (1) may be further expressed in terms of $F_1$ as follows:

$$F_3 = (F_1/1000) W \cdot F_1 \tag{2}$$

The average frequency $F_3$ may be still further expressed in terms of $F_1$ as;

$$F_3 = (W F_1^2)/1000 \tag{3}$$

Furthermore, the average frequency $F_3$ may be expressed in terms of the applied $V_0$ signal 12 by replacing the $F_1$ term of expression (3) with its equivalent term of $V_0$ as follows:

$$F_3 = (W K_1^2 V_0^2)/1000 \tag{4}$$

From expression (4) it is seen that the average frequency $F_3$ is proportional to the desired $V_0^2$ quantity. As previously mentioned, for one type of usage of the present invention this desired quantity $V_0^2$ may be representative of the square of the unwanted current ($I^2$) developed by the power generator.

The operation of the circuit arrangement 10 in the development of the average frequency $F_3$ of expression (4) is best described with reference to the timing diagram of FIG. 2. The discussion with regard to FIG. 2 and also FIGS. 3 and 4 makes reference to the period of the various signals in terms of the reciprocal of the frequency values, that is, $1/F_1$, $1/F_2$ and $1/F_3$. This type of nomenclature is used so as to relate the waveforms to their previously given description.

The circuit arrangement 10 receives the applied $V_0$ signal 12 having the positive voltage (+V) level $V_0$ which experience of step-like increase as shown in FIG. 2a. FIG. 2a shows $V_0$ as having two portions $V_0(A)$ and $V_0(B)$. The portion $V_0(B)$ is shown as having a step-like V+ increase relative to the portion $V_0(A)$. The Voltage to Frequency (V/F) Converter 14 accepts the $V_0$ signal 12 and generates the signal 16 of FIG. 2b whose period is $1/F_1$. FIG. 2b shows the signal 16 as having two different periods b $1/F_{1(A)}$ and $1/F_{1(B)}$. The periods $1/F_{1(A)}$ and $1/F_{1(B)}$ correspond, respectively, to the portions $V_{0(A)}$ and $V_{0(B)}$. From FIG. 2b it is seen that the period $1/F_{1(B)}$ of the pulses 16 is reduced as compared to the period $1/F_{1(A)}$.

The signal 16 of FIG. 2b is applied to the Divider 18, which, in turn, develops the signal 20 having the period $1/F_2$. In a manner similar as described for FIGS. 2a and 2b, from FIG. 2c it is seen that the signal 20 of FIG. 2c has two different periods which are $1/F_{2(A)}$ and $1/F_{2(B)}$. The period $1/F_{2(B)}$ is reduced relative to $1/F_{2(A)}$ and is related to the quantities $V_{0(B)}$ and $1/F_{1(B)}$.

The signal 20 of FIG. 2c is applied to the One-Shot 22, which, in turn, develops the signal 24 of FIG. 2d shown as having the pulse width W. It should be noted that converse to the variable waveforms of FIGS. 2a, 2b, and 2c, FIG. 2d shows the pulse width W of signal 24 as a fixed or non-variable quantity. The signal 24 of FIG. 2d and the signal 16 of FIG. 2b are both applied to the AND circuit 26, which, in turn, in response to the coincidence between the two applied signals 16 and 24, generates the signal 28 of FIG. 2e having the average frequency $F_3$ and period $1/F_3$.

FIG. 2e illustrates the nature of signal 28 for the two different input signal levels $V_{0(A)}$ and $V_{0(B)}$. From FIG. 2e it should be noted that the period of the pulses 16 within the confines of W in the $F_{3(A)}$ interval is $1/F_{1(A)}$ of FIG. 2b, and similarly, the period of pulses 16 within the confines of W in the $F_{3(B)}$ interval is $1/F_{1(B)}$ of FIG. 2b. Still further, it should be noted that a greater number of pulses 16 of the $1/F_{1(B)}$ characteristic of FIG. 2e fall within the pulse width W of FIG. 2d than is the case with pulses 16 of the $1/F_{1(A)}$ characteristic.

Figure 2:
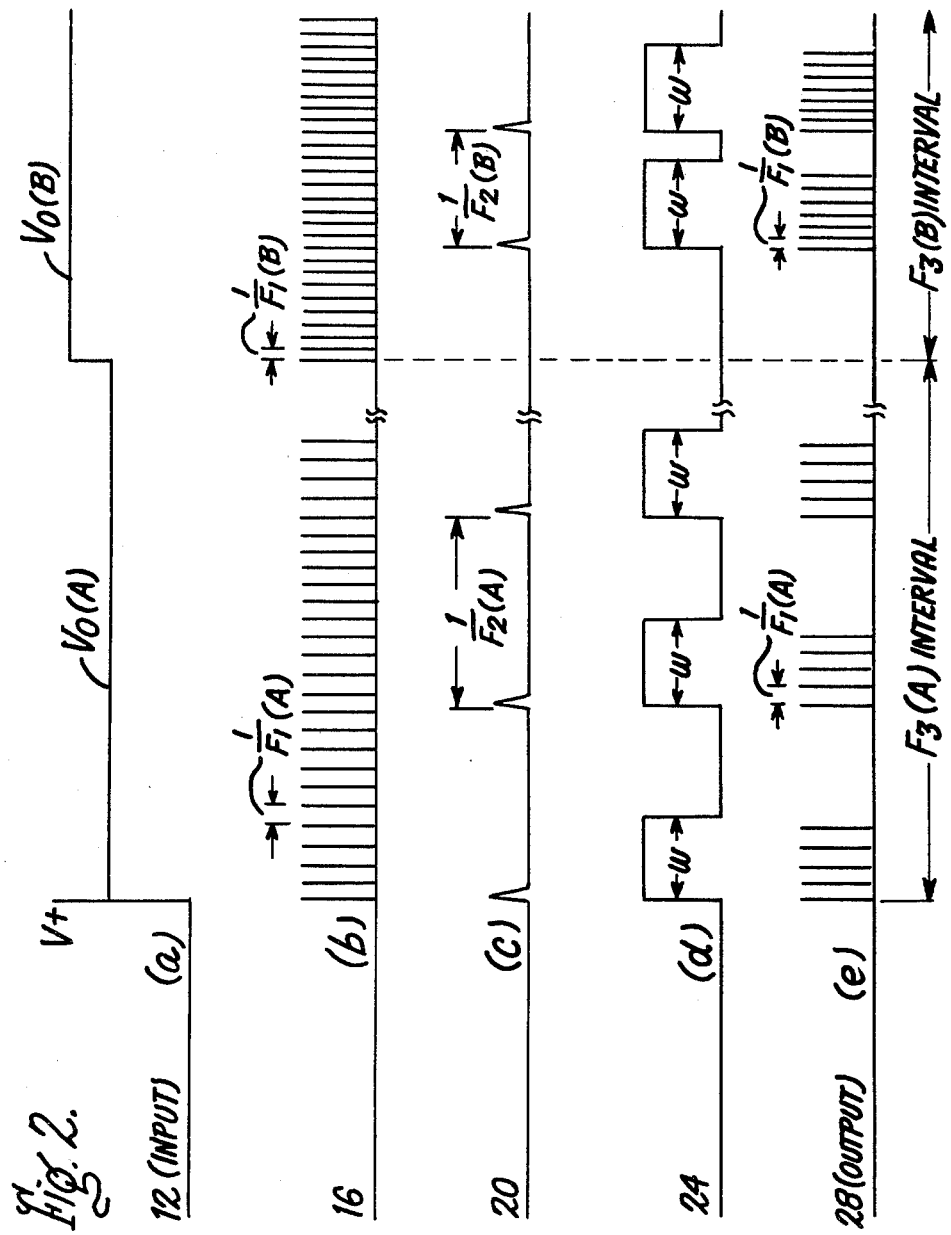
FIGS. 2 and 3 are timing diagrams related to operation of the embodiment of FIG. 1.

The operation of the circuit arrangement 10 shown in FIG. 2 is such so as to develop the output signal 28 whose average frequency is proportional to the signal $V_0^2$. As the level of signal $V_0$ is increased from the portion $V_{0(A)}$ to the portion $V_{0(B)}$ the frequency of pulses 16 correspondingly increases from $F_{1(A)}$ to $F_{1(B)}$, which, in turn, increases the numbers of pulses within the predetermined duration W or window of the signal 24 of FIG. 2d. The circuit 10 generates the output signal 28 comprised of an intermittant string of pulses whose average frequency $F_3$ is proportional to the square of the applied $V_0$ signal 12. When the frequency $F_3$ is averaged over a sufficient interval of time (T), the desired square relationship between the input 12 and output 28 signals is obtained. This desired relationship of $F_3$ to $V_0^2$ may best be described by use of Sample Calculations.

Sample Calculations For the Circuit of FIG. 1

In order to perform sample calculations for the average frequency $F_3$, certain assumptions are made.

A. Assume that the V/F Converter 14 has a D/A conversion transfer function so that upon the application of the maximum D.C. voltage of signal 12 ($V_0$), assumed to a value of 10.0 V. D.C., the V/F Converter 14 develops an output signal 16 $F_1$ having a maximum frequency of 50 KHz.

B. Assume that the Divider 18 has a Divisor (D) of 1000 so as to develop a maximum frequency $F_2$ of 50 Hz. for signal 20. The period of signal 20 is that of 0.02 seconds.

C. Assume that the pulse width W of signal 24 of the One-Shot 22 is fixed at 0.01 seconds.

For assumptions A, B, and C it may be concluded that if signal $V_0$ has a constant value of 10.0 V. D.C. it would cause the circuit arrangement 10 to develop an output signal 28 having a maximum repetition rate of 50 Hz., a pulse width of 0.01 seconds and containing pulses 16 having a frequency of 50 KHz. It should be noted that components of this signal 28 are maximum values, these components are not the average component values.

The average output frequency $F_3$ is the number of pulses of signal 16 in a window of width ($F_1$ W) times the number of windows per second which is $F_2$ or $F_1/1000$. For the above values of $F_1$=50 KHz., D=1000, and W=0.01 sec, the average output frequency may be determined as follows:

$$F_{3\ avg.} = (F_1\ W)\left(\frac{F_1}{1000}\right) \quad (5)$$

-continued $$= \frac{W F_1^2}{1000}$$

$$= (0.01)\frac{(50 \cdot 10^3 \cdot 50 \cdot 10^3)}{1000}$$

$$= 25{,}000 \text{ pulses/sec.}$$

Figure 3:
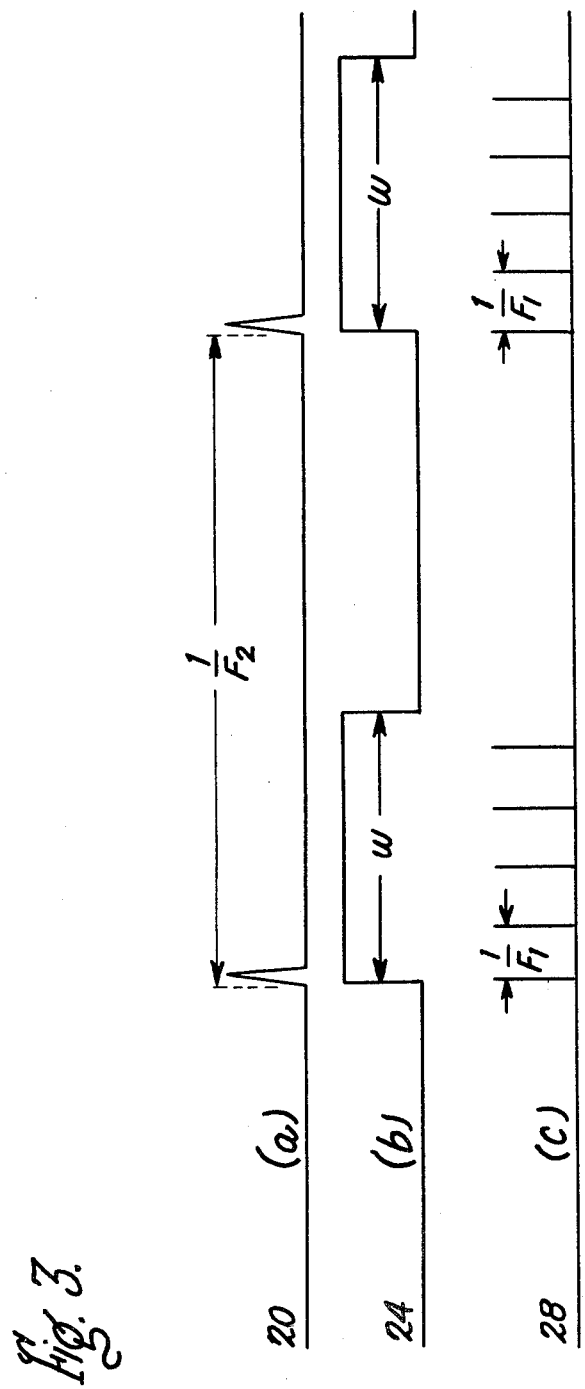

The FIG. 3 Diagram

The operation of the circuit arrangement 10, in particular the number of pulses 16 that fall within the pulse width W of signal 24, is further shown in FIG. 3. FIG. 3 further shows the signals 24 (FIG. 3b) and 28 (FIG. 3c). Signal 24 of FIG. 3b is shown to have a pulse width W commenced by the occurrence of signal 20 (FIG. 3a) and of a duration which encompasses five pulses of signal 28 each having a period $1/F_1$. FIG. 3a further shows the occurrences of signal 20 as having the period $1/F_2$.

The accuracy of the expression (4) of the average output frequency $F_3$ is dependent upon the number of pulses of signal 28, each having the period $1/F_1$, that are encompassed or fall within the width W of signal 24 of FIG. 3b. The expression (4) is very accurate, for example, 1.0% when the number of pulses of signal 28, having the period $1/F_1$, is 100. However, when the number of pulses, of signal 28 that fall within width W is small, for example, the five (5) pulses shown in FIG. 3c, then the accuracy may be only 20%.

Figure 4:
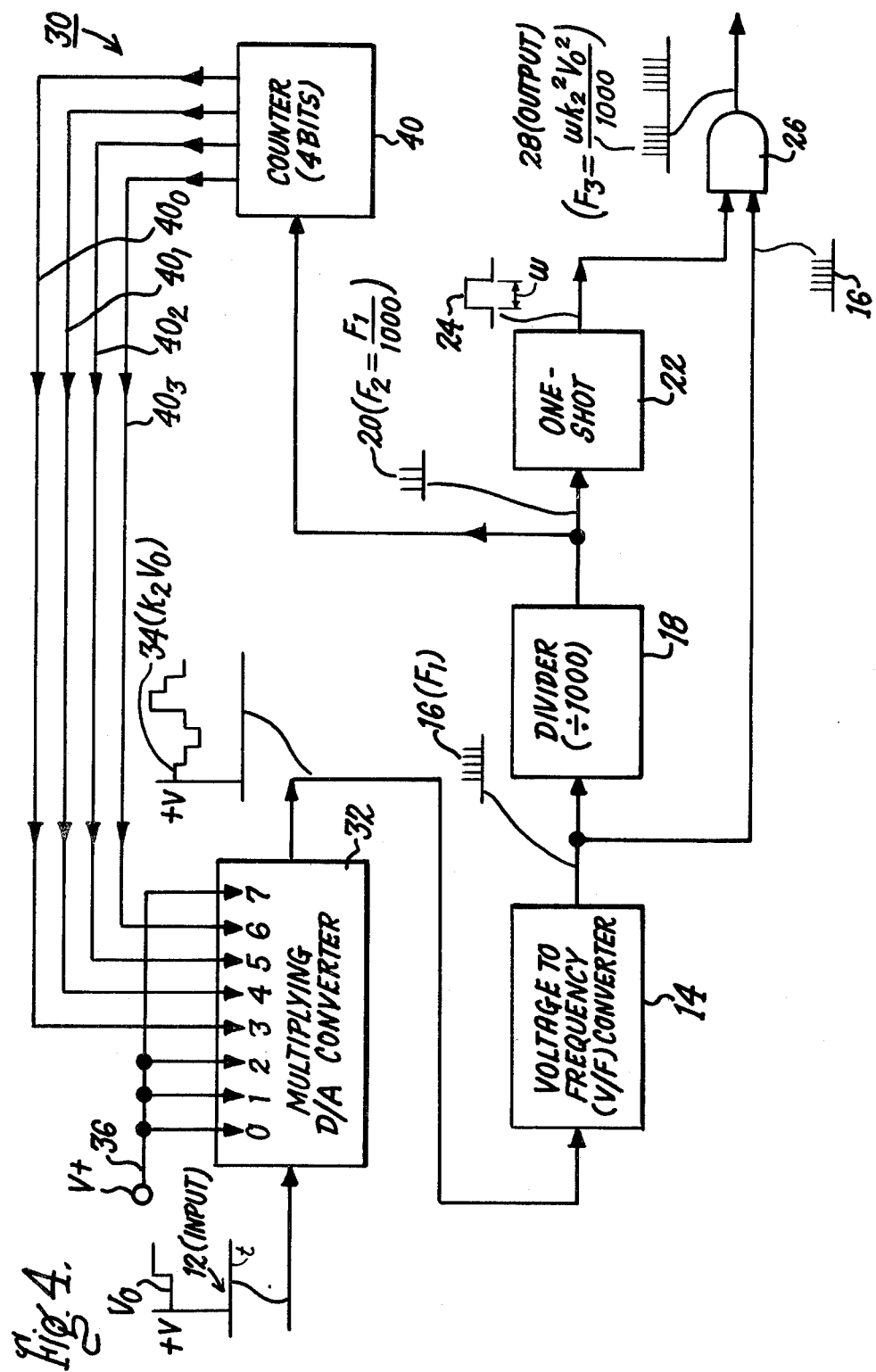
FIG. 4 shows a circuit arrangement 30 in accordance with another embodiment of the present invention.

As previously described, the frequency $F_1$ of FIG. 3c is proportional to the voltage of the applied signal 12 and a change in $1/F_1$ may alter the pulse pattern of FIG. 3c so that either four or five pulses fall within the envelope of the pulse width W of FIG. 3b and this causes an abrupt or sudden change in the average pulse rate of the $F_3$ quantity of expression (4). The circuit arrangement 30 of FIG. 4, provides the means to avoid this abrupt change to average frequency $F_3$ of signal 28 of expression (4). As will be described the primary means for smoothing these abrupt changes to the average frequency $F_3$ is provided by a jittering effect developed by a Multiplying D/A Converter 32 operating in conjunction with a Counter 40.

The Circuit of FIG. 4

The circuit arrangement 30 of FIG. 4 is similar to the previously described circuit arrangement 10 of FIG. 1 except that circuit arrangement 30 has the two additional elements 32 and 40. Element 32 is a Multiplier D/A converter available from Analog Devices Corp. of Norwood, Mass., 02062 as their type AD 7530. Element 40 is a four (4) bit Counter typically available from Motorola as their type MC 14162.

The Multiplying D/A converter 32 is responsive to, (1) the applied $V_0$ signal 12, and (2) the signal levels present on signal paths $40_0$, $40_1$, $40_2$ and $40_3$. The sum of the signal levels on signal paths $40_0$, $40_1$, $40_2$ and $40_3$ being representative of a digital quantity ($K_2$) by which the analog input signal is multiplied to provide the output signal 34.

The Multiplying D/A converter 32 receives the applied signal 12 ($V_0$) which may have an arbitrary waveshape and converts it into an analog signal 34 having a voltage $K_2V_0$, where $K_2$ constantly varies through a fixed sequence of values. Signal 34 as shown in FIG. 4 is an analog signal having a staircase-type waveform to be described hereinafter. The voltages at each portion of each staircase of signal 34 respectively correspond to the input signal 12 ($V_0$) multiplied by some $K_2$ value. In FIG. 4 only four (4) values of $K_2$ are illustrated for clarity. In one commercial embodiment there are 16 steps.

The conversion constant $K_2$ of the Multiplying D/A Converter 32 is determined by the digital quantity present on signal paths $40_0$, $40_1$, $40_2$ and $40_3$. The digital quantity on signal paths $40_0$, $40_1$, $40_2$ and $40_3$ is determined by the operation of the Counter (4 bits) 40.

The value of the digital quantity is representative of the number of occurrences per unit of time of the second output signal 20 within a predetermined range of values, such as from 0 to 15. The digital quantity provides a variable input to the Multiplying D/A Converter 32, which, in turn, causes the Multiplying D/A Converter 32 to develop a step like changing or jittered analog type signal $K_2V_0$.

The Counter 40 provides the means for repetitively counting the string of pulses of the second output signal 20 and generates in response to the repetitive counting the digital quantity present on signal paths $40_0 \ldots 40_3$. The Counter 40 increments its count at the rate of $F_1/1000$ which as previously discussed is the rate of the output signal 20 of the Divider 18. The digital signals present on signal lines $40_0$, $40_1$, $40_2$, and $40_3$ are respectively applied to the inputs 3, 4, 5, and 6.

The Multiplying D/A converter 32 is shown to have inputs 0, 1, 2, 3, 4, 5, 6, and 7. The inputs 0 . . . 7 have a sum of an octal equivalent of 255 representative of the total states of the registers of device 32 and the output quantity of device 32 is scaled by the 255 value. The signal level applied to these inputs are representative of a desired decimal value for the conversion constant $K_2$. The Multiplying D/A converter 32 is shown to have its inputs 0, 1, 2, and 7 connected to a positive potential V+ via signal paths 36. This V+ potential manifests itself as a logic 1 to the Multiplying D/A converter 32. Conversely, the output of the counter 40 which is a variable quantity is applied to the third (3), fourth (4), fifth (5), and sixth (6) inputs. If a signal is present on all of the signal paths $40_0 \ldots 40_3$ such a condition is representative of a $K_2$ decimal value of 255/255. Conversely, if all the signals are low on signal path $40_0 \ldots 40_3$, such a condition is representative of a $K_2$ decimal value of 135/255. The value 135/255 is the $K_2$ quantity when inputs 0, 1, 2, and 7 only are high.

These values of 135–255, with respect to the base 255, representative of the previously mentioned range of the digital quantity applied to Multiplying D/A Converter 32 jitters its output signal $K_2V_0$.

The Multiplying D/A converter 32 in response to the variable decimal value present on signal paths $40_0 \ldots 40_3$ multiplies the analog $V_0$ signal 12 by the variable conversion constant $K_2$ so as to develop the output signal 34 scaled by different $K_2$ quantities at different times. The signal 34 is applied to the previous described Voltage to Frequency (V/F) converter 14. The Voltage to Frequency converter 14, the Divider 18, the One-Shot 22, and the AND circuit 26 operate in a manner as described for the circuit arrangement of FIG. 1. The overall operation of the circuit arrangement 30 of FIG. 4 is best described by first referring to FIG. 5.

Figure 5:
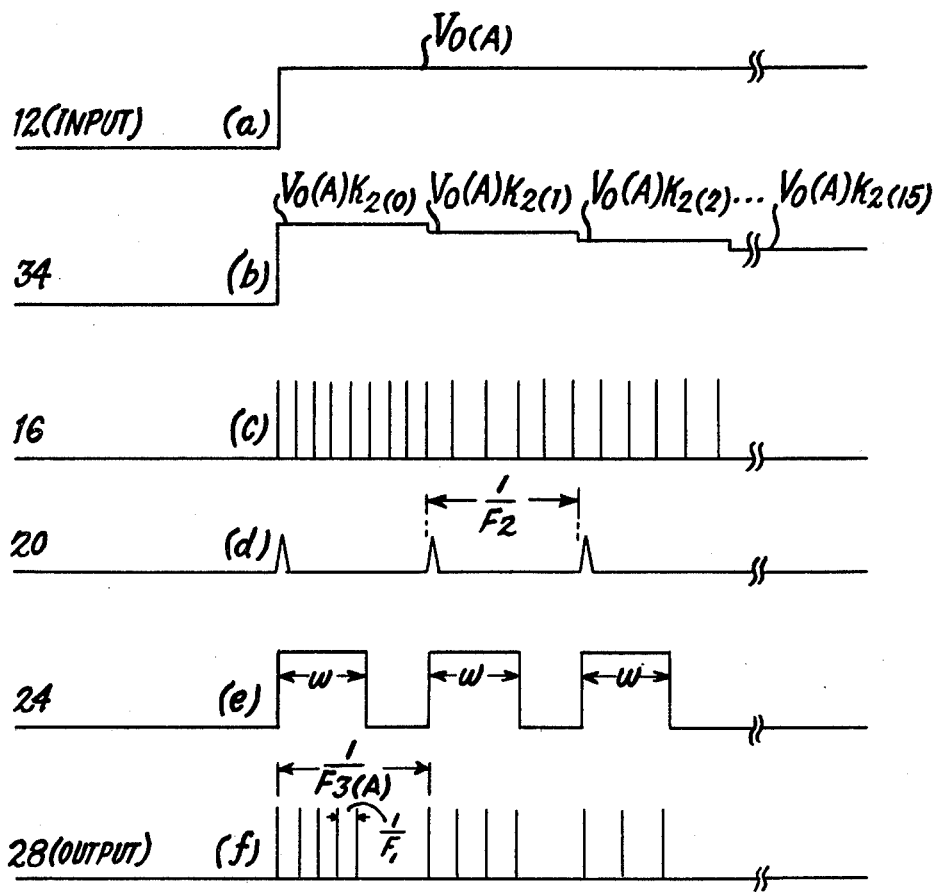
FIG. 5 is a timing diagram related to the circuit arrangement 30.

FIG. 5 shows the signals 12 (FIG. 5a), 16 (FIG. 5c), 20 (FIG. 5d), 24 (FIG. 5e) and 28 (FIG. 5f) previously described with regard to FIGS. 1 and 2, and the signal 34 of FIG. 5b not previously discussed with regard to FIGS. 1 and 2. The signal 34 of FIG. 5b shows an essential difference between the circuit arrangements 10 and 30 of FIGS. 1 and 4 respectively.

The signal 34 is shown in FIG. 5b as having sixteen (16) staircase portions $V_{0(A)} K_{2(0)}$, $V_{0(A)} K_{2(1)}$, $V_{0(A)} K_{2(2)} \ldots V_{0(A)} K_{2(15)}$. It should be noted that the amplitude of the voltage of signal 34 is in actuality a value of $K_{2(0)} \ldots (15)$ multiplied by the quantity $V_0$. The portions $V_{0(A)} K_{2(0)} \ldots V_{0(A)} K_{2(15)}$ are related to the previously discussed quantity $V_{0(A)}$ of FIG. 2a which is also shown in FIG. 5a.

The operation of circuit arrangement 30 in response to signal 34 is best described by sequentially referring to FIGS. 5a through 5f. FIGS. 5a and 5b show the Multiplying D/A Converter signal 34 as having an initial or starting count value of $K_{2(0)}$ corresponding to the highest value of $K_2$, whereas, in actuality the starting count is arbitrary and for the following description is referred to as $K_{2(M)}$. The initial occurrence of quantity $V_{0(A)}$ causes the Multiplying D/A Converter 32 to develop the quantity $V_{0(A)} K_{2(0)}$ of FIG. 5b having some amplitude equal to $K_{2(M)} V_0$. The $K_{2(M)} V_0$ quantity of FIG. 5b is applied to the Voltage to Frequency (V/F) which develops the initial signal 16 of FIG. 5c having a repetition rate proportional to the applied quantity $K_{2(M)} V_0$ of signal 34. The signal 16 of FIG. 5c is applied to Divider 18 which develops the signal 20 of FIG. 5d having a repetition rate or frequency $1/F_2$ proportional to its applied signal $F_1$. The signal 20 of FIG. 5d is applied to One-Shot 22 which develops the initial signal 24 of FIG. 5e. The initial signal 24 of FIG. 5d and the initial signal 16 of FIG. 5c are applied to the AND circuit 26 which responds to the coincidence between initial signals 16 and 24 by developing the left hand signal of 28 in FIG. 5f shown by a burst of five pulses which occur during the previously discussed predetermined duration W of signal 24.

The second occurrence of signal 20 of FIG. 5d is detected by the Counter 40 which, in turn, responds by changing its digital value quantity supplied to Multiplying D/A Converter 32 from for example, 255/255 to 247/255, which, in turn is responded to by the Multiplying D/A Converter 32 by changing its multiplying constant shown in FIG. 5b for example as changing from $K_{2(0)}$ to $K_{2(1)}$. The signal 34 is shown in FIG. 5b as reflecting the change of the multiplying constant from $K_{2(0)}$ to $K_{2(1)}$ as evidenced by the slight lowering of its amplitude.

The third occurrence of signal 20 of FIG. 5d is responded to, by Counter 40 and Multiplying D/A Converter 32 in a manner similar to the second occurrence of signal 20, and the amplitude of signal 34 is shown to drop to a value corresponding to the $K_{2(2)}$ multiplying constant. The amplitude of signal 34 in response to the $K_{2(2)}$ multiplying constant is shown in FIG. 5b as being slightly less than that of the amplitude related to the multiplying constant $K_{2(1)}$. The sequential slight reduction of the amplitude of signal 34 continues for sixteen (16) steps and then repeats. The staircase voltage pattern of signal 34 repeats in a substantially precise manner so long as the input 12 remains constant at $V_{0(A)}$.

From review of FIG. 5 various observations may be made, which are for a fixed input voltage 12, (1) the repetition rate of signal 16 is a variable function in response to the variable amplitude of signal 34 due to a varying $K_2$ quantity and which may be noted from FIG. 5c by comparing the spacing between the pulses 16 related to $K_{2(0)}$, $K_{2(1)}$ and $K_{2(2)}$, (2) the repetition rate of signal 20 is a variable function in response to the variable repetition rate of signal 16 and which may be noted from FIG. 5d by comparing the spacing between the pulses 20 related to $K_{2(0)}$, $K_{2(1)}$ and $K_{2(2)}$, (3) the pulse width W of signal 24 of FIG. 5e is a fixed quantity, and (4) the number of pulses in a burst of signal 28 varies in number during the presence of fixed signal 12 $V_{0(A)}$, and which may be noted in FIG. 5f in that the number of pulses within pulse bursts related to $V_{0(A)}$ are five (5), four (4) and three (3).

The variation in the number of pulses within each burst of pulses of output signal 28 reduces the previously described effect where the number of pulses within the burst of pulses of output signal 28 that fall within the predetermined duration W of signal 24 may experience an abrupt change such as from 4 to 5. The reduction in the abrupt change is primarily realized in that sixteen different pulse rates may occur for signal 16 in response to the sixteen different amplitudes of signal 34 even though signal 12 is constant. The sixteen different rates of pulse 16 provide a smoothing or smearing effect on any abrupt change. For example, if signal 12 varies slightly and one (1) of the sixteen (16) rates developed by signal 34 gives a transition from four (4) to five (5) pulses 16 which fall within the pulse width W of signal 24, it is probable that none of the other fifteen (15) pulses rates developed by signal 34 will generate a transition in the number of pulses 16 which fall within the fixed width W of signal 24.

The average frequency $F_3$ of the output signal 28 of the circuit arrangement 30 of FIG. 5f may be expressed in a similar manner as described for expression (1), (2), (3) and (4) related to circuit arrangement 10 of FIG. 1. More particularly, the average frequency $F_3$ of the output signal 28 of circuit arrangement 30 may be expressed, in a manner similar to expression (4) of circuit arrangement 10, in terms of $V_0$ as follows:

$$F_3 = (W K_2^2 V_0^2)/1000 \qquad (5)$$

where $K_2$ varies in accordance with the repetition rate of $F_2$ but has some fixed average value. The desired relationship $F_3$ of circuit arrangement 30 of FIG. 4 may best be described by use of Sample Calculations.

Sample Calculations For the Circuit of FIG. 4

The second embodiment 30 of the present invention operates in a slightly different manner than the first embodiment 10. For this reason the calculations differ somewhat. The initial assumption A, B, and C related to the first embodiment 10 are also applicable to the second embodiment 30 and the subsequent calculations for the second embodiment 30 proceed as follows:

With assumptions A, B, and C made, the next step is to calculate the maximum ($F_3$ max.) and minimum ($F_3$ min.) of average frequencies $F_3$ of circuit arrangement 30. To calculate these maximum ($F_3$ max.) and minimum ($F_3$ min.) average frequencies $F_3$, it is necessary to have a value or figure for the average D/A conversion transfer function of the stepped D/A conversion of V/F Converter 14. This figure may be determined by the following assumption D;

D. Assume that the maximum D/A conversion transfer function (Max. D/A) value is one (1) and the minimum D/A conversion transfer function (Min. D/A) value is one-half ($\frac{1}{2}$) so that three-quarters ($\frac{3}{4}$) is a valid average transfer function (Avg. D/A). Assumption D means that the average V/F output frequency $F_1$ of signal 16, with the D.C. input voltage at its maximum voltage of 10.0 V. D.C. for signal 12 ($V_0$) applied to the Multiplying D/A converter 32, is three-quarter ($\frac{3}{4}$) of the maximum frequency of signal 16 of 50 KHz or 37.5 KHz.

To determine the minimum frequency of signal 16 the following assumption E is made.

E. Assume the minimum input voltage is (0.01) of the maximum value of signal 12 ($V_0$). For the maximum value of $V_0$ of 10 V. D.C. previously given, this minimum value of $V_0$ would correspond to 0.1 V. D.C. For this minimum value of 0.1 V. D.C. for $V_0$, it causes a minimum value of V/F frequency $F_1$ of signal 16 of 37,500 (Avg. $F_2$) times (0.01) or 375 Hz.

With assumptions A, B, C, D and E made, the following conclusion F may be made:

F. At the maximum D.C. voltage of 10.0 V. D.C. of signal 12 ($V_0$) applied to Multiplying D/A Converter 32, and with the Avg. D/A of three-quarter ($\frac{3}{4}$) so as to develop the average V/F frequency $F_1$ of signal 16 of 37,500 Hz., then the Divider 18 output signal 20 (Avg. $F_2$) is 37,500 Hz./1000 or 37.5 Hz.

Further, with the One-Shot 22 pulse width W of signal 24 of a duration of 0.1 seconds, the total width or gate-on time of signal 24 is 37.5 Hz. (Avg. $F_2$) times (0.1 sec.) or 0.375 seconds. This 0.375 seconds is time that signal 24 is present or on during every one (1) second duration.

For the conditions of conclusion F, the number of pulses of signal 16 gated out by AND gate 26 and by signal 24 in a one second duration may be expressed as:

$$(0.375)(37,500 \text{ Hz.}) = 14,062.50 \text{ Hz.}$$

In a manner similar as that described for conclusion F the following conclusion G may be made:

G. At the maximum D.C. voltage of 10.0 V. D.C. of signal 12 applied to the D/A Converter 32 and with the Min D/A of one-half ($\frac{1}{2}$) so as to develop a signal 34 of 5.0 volts which is applied as the input to the V/F Converter 14 so that the V/F Converter 14 develops a frequency $F_1$ of 25,000, then the Divider 18 output signal 20 is 25,000 Hz./1000 or 25 Hz.

Further, with the One-Shot 22 pulse width of 0.01 seconds, the total width or gate-on time of signal 24 is 25 Hz. times (0.01) or 0.25 seconds. This 0.25 seconds is the time that signal 24 is present or on during every one (1) second duration.

For the conditions of conclusion G, the number of pulses 16 gated out to an external source by signal 24 in a one second duration may be expressed as:

$$(0.25)(25,000 \text{ Hz.}) = 6,250 \text{ Hz.}$$

In a manner as described for conclusions F and G, the following conclusion I may be made:

I. At the minimum voltage of 0.1 V. D.C. for signal 12 ($V_0$) applied to D/A converter 32, and with the Max. D/A of one (1) so as to develop a frequency of signal 16 of 50 KHz. times (0.01) or 500 Hz., then the Divider 18 output signal 20 is 500 Hz./1000 or 0.5 Hz. which is one output burst of signal 20 every 2 seconds.

Further, with One-Shot 22 pulse width of signal 24 of a duration of 0.01 seconds, the total width or gate-on of signal 24 is 0.5 Hz. times (0.01 sec) or 5 msec in a one second duration which is an average figure.

For the conditions of conclusion I, the number of pulses 16 gated out by AND gate 26 and by signal 24 in a one (1) second duration may be expressed as:

(0.005) (500 Hz.) = 2.5 Hz.

This 2.5 Hz. characteristic corresponds to the occurrence of 5 pulses per burst (0.01 sec gate width times 500 Hz.).

In a manner similar as described for conclusion F, G, and I, the following conclusion J may be made:

J. At the minimum voltage of 0.1 V. D.C. for signal 12 ($V_0$) applied to the D/A converter 32, and with the Min D/A of one-half ($\frac{1}{2}$) so as to develop a frequency of signal 16 of 25 KHz. times (0.01) or 250 Hz., then the Divider 18 output signal 20 is 250 Hz./1000 or 0.25 Hz. which is one output burst of signal 20 every 4 seconds.

Further, with One-Shot 22 pulse width of signal 24 of a duration of 0.01 seconds, the total width or gate-on of signal 24 is (0.25 Hz.) times (0.01 sec) or 2.5 msec in a one second duration which is an average figure.

For the conditions of conclusion J, the number of pulses 16 gated out by AND gate 26 by signal 24 in a one (1) second duration may be expressed as:

(0.025) (250 Hz.) = 0.625 Hz.

This 0.625 Hz. characteristic corresponds to the occurrence of 2.5 pulses per burst of signal 28 with a burst occurring every 4 seconds. In actuality, the occurrence of 2.5 pulses output to a counter in a digital system is, in effect, a 3 pulse burst, therefore the practical number of pulses is 3 pulses per burst. From conclusions G and I it is seen that with an input of 0.1 V. D.C. of signal 12 ($V_0$) applied the D/A converter 32, the V/F pulses 16 per One-Shot 22 pulse width (W) which are gated to an external source, ranges from 3 to 5. This range of 3 to 5 pulse provides a reasonable accuracy for relatively small input changes in the vicinity of 0.1 V. D.C.

Figure 6:
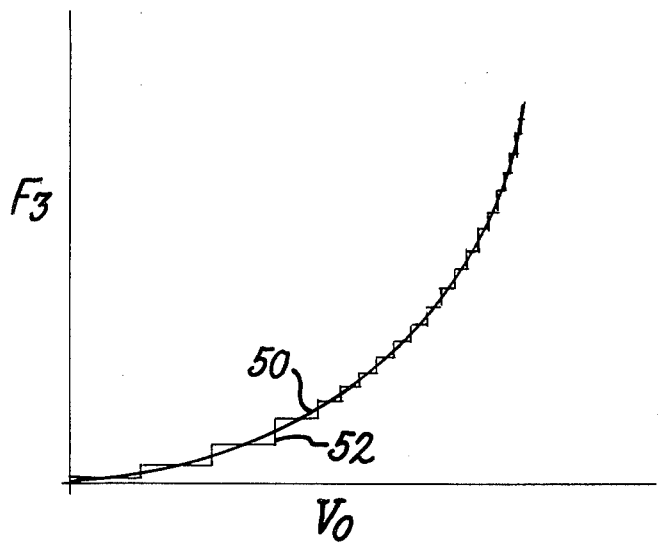
FIGS. 6 and 7 show respectively the response of circuit arrangement of FIGS. 1 and 4 of average frequency $F_3$ versus applied signal $V_0$.
Figure 7:
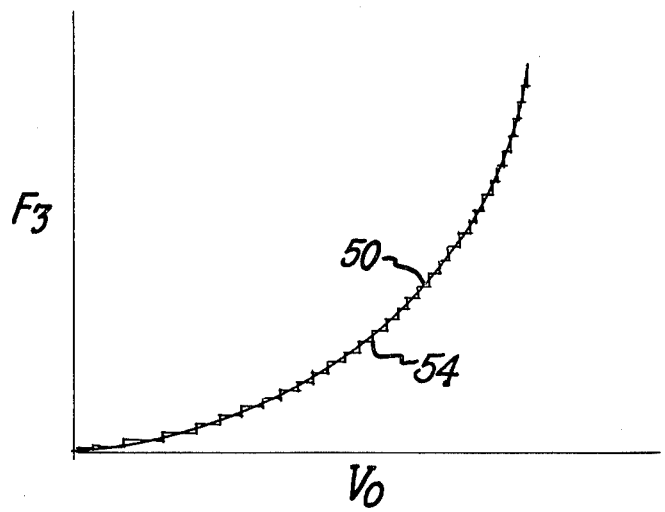

The Diagrams of FIGS. 6 and 7

The frequency response obtained by circuit arrangements 10 and 30, and a comparison of an improved response of circuit arrangement 30 relative to circuit arrangement 10, is best described with reference to FIGS. 6 and 7.

FIG. 6 shows the response of the circuit arrangement 10 of the average frequency $F_3$ versus the applied signal $V_0$. Similarly, FIG. 7 shows the response of the circuit arrangement 30 of the average frequency $F_3$ versus the applied signal $V_0$. FIG. 6 illustrates a smooth ideal curve 50 of the frequency response $F_3$ and a staircase response 52 of $F_3$ obtainable by circuit arrangement 10. Similarly, FIG. 7 illustrates the smooth ideal curve 50 of the frequency response $F_3$ and a staircase response 54 of $F_3$ obtainable by circuit arrangement 30.

FIG. 6 shows the staircase response 52 as having a plurality of steps in which the middle portion of each step intercepts the ideal response 50 of $F_3$. Still further, FIG. 6 shows the size of the plurality of the stairs of the staircase response 52 as initially, that is at being near the origin of the $F_3$ and $V_0$ coordinates, being relatively slowing ascending, and then as the ideal response 50 increases relatively rapidly the stairs correspondingly ascend relatively rapidly. The relatively-rapidly-ascending-stairs of staircase 52 have boundaries which very closely follow response 50, whereas, the boundaries of the lower-slowing-ascending stairs of staircase 52 are not as close to response 50 as the rapidly ascending stairs of staircase 52.

FIG. 7 shows the staircase 54 as comprised of more rapidly-ascending-stairs relative to the staircase 52 of FIG. 6. More particularly, the lower portion of the staircase 54 of FIG. 7 has a substantially greater number of stairs relative to the lower portion of the staircase 52 of FIG. 6. The increased number of stairs of the staircase response 54 of circuit arrangement 30 is provided by the previously described operation of signal 34. The increased number of stairs of staircase 54 provide a $F_3$ to $V_0$ response characteristic of circuit arrangement 30 which closely follows the ideal response 50 of $F_3$, and in particular, closely follows the ideal response 50 at lower values to the applied signal $V_0$.

General

It should now be appreciated that the present invention provides various embodiments of voltage to frequency converters each having a digital output signal which is proportional to the square of the analog type signal applied to each of the various frequency converters.

As previously mentioned, the divisor (D) related to signal 16 may be of a value other than 1000 and also the pulse width W of signal 24 may be of a value other than 0.01 sec. The values D and W are dependent on the desired integration time of the external device accepting the output signal 28 and the voltage range of the external device supplying the input signal 12. Increasing the Divisor D increases the dynamic range but also the integrating time required for the external device accepting the output signal 28.

While I have shown and described particular embodiments of my invention, it will be obvious to those skilled in the art that various changes and modifications may be made without departing from my invention in its broader aspects; and I, therefore intend herein to cover all such changes and modifications as fall within the true spirit and scope of my invention.

What I claim is:

1. A circuit arrangement for receiving an applied, analog type electrical signal $V_0$ and generating a pulse train output signal whose average frequency $F_3$ is proportional to the square of the applied analog type electrical signal $V_0$, said circuit arrangement comprising:

(a) analog to frequency converter means for converting said applied analog signal $V_0$ to a first digital output signal comprising a string of pulses of a frequency $F_1 = K_1 V_0$, where $K_1$ is a predetermined analog to digital conversion constant;

(b) means for dividing said first output signal by a predetermined divisor D so as to develop a second output signal comprising a string of pulses whose frequency is $F_2 = F_1/D$; said frequency $F_2$ being relatively lower than said frequency $F_1$;

(c) means responsive to said second output signal for generating a third output signal having a pulse rate whose frequency is equal to said frequency $F_2$ of said second output signal and a pulse width of a predetermined duration W which is less than the period of the second output signal;

(d) means receiving said first and third output signals and responsive to coincidence between said first and third output signals for developing a pulse in response to each such coincidence, thereby generating a train of pulses whose average frequency $F_3$ equals $(W K_1^2 V_0^2)/D$, thus rendering $F_3$ proportional to $V_0^2$.

2. A circuit arrangement for receiving an applied analog type electrical signal $V_0$ and generating a pulse train output signal whose average frequency $F_3$ is proportional to the square of the applied analog electrical signal $V_0$, said circuit arrangement comprising:
  (a) converting means responsive to (1) the applied signal $V_0$ and (2) a first digital signal, said converting means transforming the signal $V_0$ by a factor $K_2$ representative of said digital signal so as to develop a step like changing or jittered analog type signal represented by the expression $K_2V_0$;
  (b) analog to frequency converter means for converting said analog type signal $K_2V_0$ to a first output signal comprising a string of pulses having a frequency $F_1=K_2V_0$;
  (c) means for dividing said first output signal by a predetermined divisor D so as to develop a second output signal comprising a string of pulses having a frequency $F_2=F_1/D$, said frequency $F_2$ being relatively lower than said frequency $F_1$;
  (d) means for counting said string of pulses of said second output signal and generating in response to said counting said first digital signal having a value representative of the frequency of said second output signal and providing a variable input to said converting means;
  (e) means responsive to said second output signal for generating a third output signal having a pulse rate whose frequency is equal to said frequency $F_2$ of second output signal and a pulse width of a predetermined duration W which is less than the period of the frequency $F_2$;
  (f) means receiving said first and third output signals and responsive to coincidence between said first and third output signals for developing a pulse in response to each such coincidence, thereby generating a train of pulses whose average frequency $F_3=(W K_2V_0^2)/D$, thus rendering $F_3$ proportional to $V_0^2$.

3. The circuit arrangement according to claim 1 or claim 2 wherein said means receiving said first and third output signal comprises an AND circuit.

4. The circuit arrangement according to claim 1 or claim 2 wherein said means responsive to said second output signal for generating a third output signal comprises a One-Shot.

5. The circuit arrangement according to claim 2 wherein said means for counting generates said first digital signal further having a predetermined range.

* * * * *